United States Patent [19]

Smart et al.

[11] 4,303,297
[45] Dec. 1, 1981

[54] SOCKET STRUCTURE FOR ELECTRICAL COMPONENTS

[75] Inventors: David C. Smart, Penfield; Paul F. Black, Dansville, both of N.Y.

[73] Assignee: Eastman Kodak Company, Rochester, N.Y.

[21] Appl. No.: 134,043

[22] Filed: Mar. 26, 1980

[51] Int. Cl.³ .................. B29C 24/00; H01R 13/506; H01R 13/514
[52] U.S. Cl. ........................ 339/218 M; 339/176 L; 264/295
[58] Field of Search .............. 339/17 D, 17 F, 95 D, 339/218 R, 218 M, 98, 4, 97 C, 176 R, 176 M, 176 MF, 176 L, 206 L, 207 R, 207 S, 208, 209, 210 T; 264/272, 279, 295

[56] References Cited

U.S. PATENT DOCUMENTS

| | | | |
|---|---|---|---|
| 3,410,950 | 11/1968 | Freudenberg | 339/97 C X |
| 4,056,299 | 11/1977 | Paige | 339/218 RX |
| 4,069,289 | 1/1978 | Krasser et a. | 264/272.11 |
| 4,193,659 | 3/1980 | Deverrewaere | 339/17 D |
| 4,202,091 | 5/1980 | Ohnishi | 264/279 X |
| 4,217,017 | 8/1980 | Herbner | 339/17 F |

*Primary Examiner*—Eugene F. Desmond
*Attorney, Agent, or Firm*—D. R. Arndt

[57] ABSTRACT

A unitary socket for an electrical component comprises two plastic body members that are outsert molded to conductor straps which grip lead members of the electrical component and also provide hinge elements that connect the two body members. The body members are molded in coplanar relation to each other; and the hinge elements are then folded to bring the body members into confronting abutment. Additionally, the conductor straps also provide clip elements for holding the body members in the latter relation to one another. One of the body members defines at least one component collar with guide holes in its base for guiding the leads of an electrical component into gripping engagement with the respective conductor straps in the second body member. This mode of construction allows the socket to be formed as a unitary structure without the need for complicated molding dies, or flexible plastic elements.

5 Claims, 7 Drawing Figures

SOCKET STRUCTURE FOR ELECTRICAL COMPONENTS

BACKGROUND OF THE INVENTION

1. Field of the Invention

The present invention relates to sockets for electrical components and more particularly to a unitary socket comprising two plastic body members outsert molded to a plurality of conductor straps which serve as hinge means to allow the body members to be brought into confronting relation to one another. In addition, the conductor straps cooperate with the plastic body members to form clip means that secure the body members in confronting relation.

2. Description of the Prior Art

The prior art includes various examples of electrical component sockets which comprise two molded plastic body members joined by a flexible plastic hinge that allows the body members to be molded in side-by-side relation to one another and then to be folded about the hinge to bring the body members into confronting alignment. It is also known to incorporate the various conductor elements of the socket into one or more of the body members by means of insert or outsert molding techniques. However, this mode of construction dictates that the plastic material used be flexible to provide the plastic hinge structure and plastic clip elements which retain the body members in their confronting assembled relation to one another.

It is apparent that if the clip elements are defined by the body members, this usually dictates a structural configuration where both mutually engageable clip elements cannot be produced by a simple two cavity injection molding die having a single parting line. In other words, the molding die required to produce the undercut surface of the hook or the like by which one of the body members is latched to the other body member requires a "side pull" die element or the equivalent, which is relatively complicated and expensive. Furthermore, the relatively fragile plastic hinges and/or latching structure may be susceptible to deterioration through age and heat.

SUMMARY OF THE INVENTION

In accordance with the present invention, an electrical socket is provided having first and second molded plastic body members which are outsert molded to metal conductor straps. During the manufacturing process, the conductor straps and body members are originally substantially coplanar with one another, with the body members spaced apart and joined by bendable portions of the conductor straps. This provides a hinge structure that allows the mutually facing surfaces of the body members to be positioned in confronting abutment with one another by bending the hinge portions of the conductor straps. The body members have complementary mating elements that are engageable with one another to align the body members when the body members are in confronting abutment. Guide holes are provided in one of the body members for receiving the leads of an electrical component such as an LED and for aligning those leads with the lead gripping structures defined by the respective conductor straps.

The socket further comprises a clip engagement surface on one of the plastic body members along the edge opposite the hinge structure. A clip element is defined by a portion of a conductor strap adjacent the other plastic body member so that the clip element is engageable with the clip engaging surface when the body members are in confronting abutment with one another.

The invention, its objects and advantages, will become more apparent in the detailed description of a preferred embodiment presented below.

DESCRIPTION OF THE DRAWINGS

In the detailed description of a preferred embodiment of the invention presented below, reference is made to the accompanying drawings, in which.

DESCRIPTION OF THE PREFERRED EMBODIMENT

Figure 1:
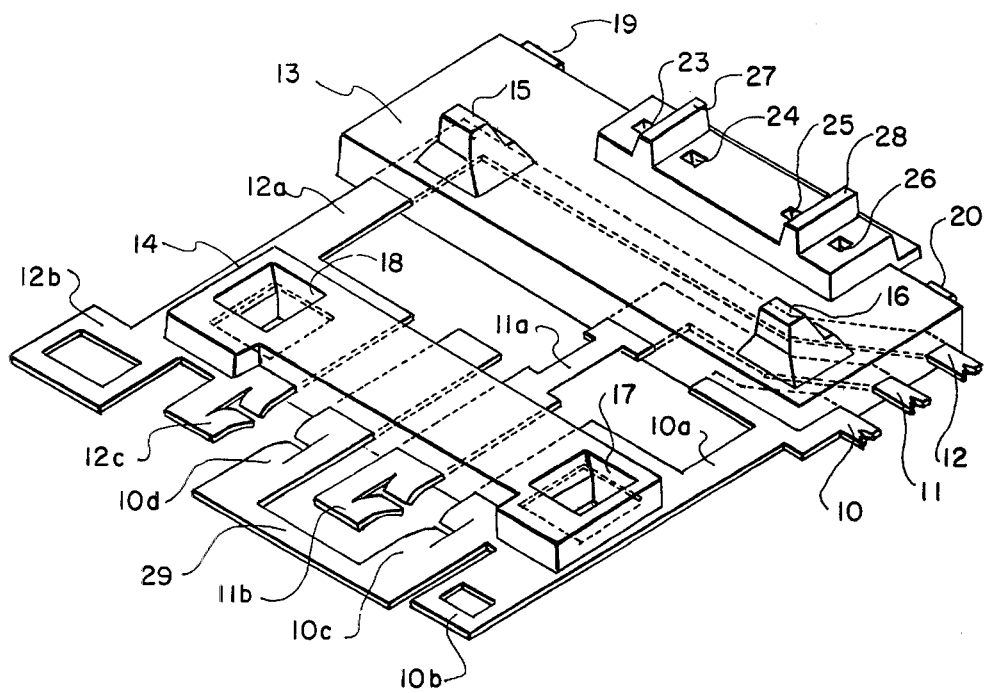
FIG. 1 is a perspective view of a preferred embodiment of the invention comprising a socket for two light emitting diodes (LED's) depicting the condition in which the plastic body members are molded to the conductor straps.

FIG. 1 best shows the structure of the illustrative socket, depicted in the flat condition in which the respective body members 13 and 14 are molded to conductor straps 10, 11, and 12. The conductor straps are die cut from a single band of sheet metal stock in a progressive die with the straps in the same relation to each other that they assume in the finished socket. As is customary in such progressive die operations, various connector webs or bridge bars, not shown, are left between the various elements being produced and between those elements and the surrounding strip material to maintain the configuration and relative disposition of the various elements as the strip is intermittently moved to bring successive portions thereof into alignment with successive die stations.

After those portions of the conductor straps aligned with the body members have been completely defined, but while the straps are still connected to each other and the surrounding strip material, they are brought into alignment with an injection molding die. This die comprises a pair of die blocks that define mold cavities and channels, which receive the portions of the conductor straps extending beyond the cavities. Molten plastic is then injected into the mold cavities to define the body members, but cannot escape through the conductor strap channels because of the close fit between those channels and the straps received therein. This technique, which is conventionally known as "outsert" molding, thus allows the plastic components of the socket to be formed while the metal portions thereof are still carried by the original band from which those original parts are cut; thus eliminating the need for separate handling operations. After the "outsert" molding operation has been completed, the partially finished socket, still carried by the band, moves incrementally to one or more successive punch and die stations where the various further metal forming operations are performed and where the connecting webs and/or bridge bars are finally removed to complete the socket structure and separate it from the band.

When formed, the first and second body members are in a coplanar relationship, as illustrated in FIG. 1, and are held in a spaced apart relationship by conductive portions 10a, 11a, and 12a of the conductor straps 10, 11, and 12, which enter one end of the first body member and exit from the side thereof after having made a right angle change in direction in the first body member.

Conductive portion 12a extends into one side of the second body member 14 and out the opposite side thereof, where it forms a clip element 12b and a lead-gripping structure 12c. The conductive portion 11a also extends through the second body member from side to side and forms a lead-gripping structure 11a on the exit side of the body member. In a similar fashion, conductive portion 10a extends through the second body member, exiting on the opposite side where it forms a clip element 10b and two lead-gripping structures, 10c and 10d.

Figure 2:
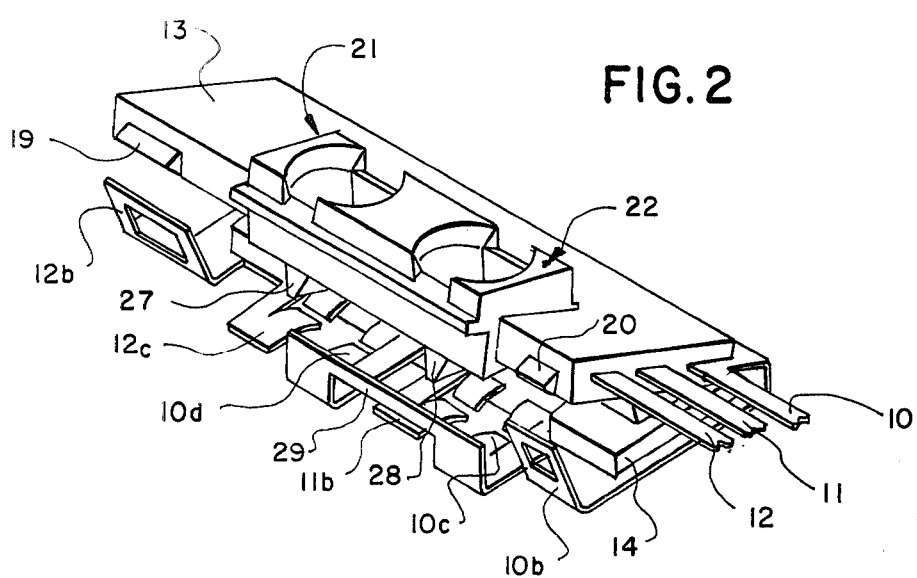
FIG. 2 is a perspective view showing the socket illustrated in FIG. 1 in the process of being folded into completed condition.
Figure 3:
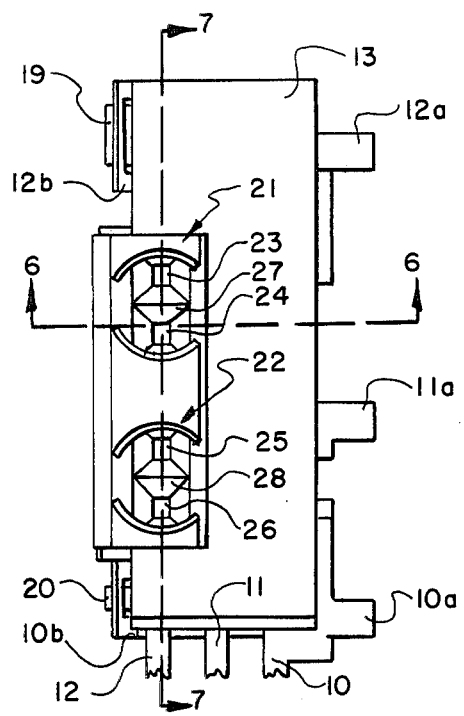
FIG. 3 is a top plan view of the completed socket.

Conductive portions 10a, 11a, and 12a, that connect the body members 13 and 14, also act as hinge means when the two body members are folded into confronting relationship during manufacture, as shown in FIG. 2. Body member 13 is provided with a pair of alignment pins 15 and 16 that are received in openings 17 and 18 respectively of body member 14, thereby insuring proper alignment and registration of the body members during the folding operation. Tabs 19 and 20 on the side of body member 13 are engaged by clip elements 12b and 10b, respectively to latch the two body members in confronting relationship, thereby completing the unitary socket.

Figure 7:
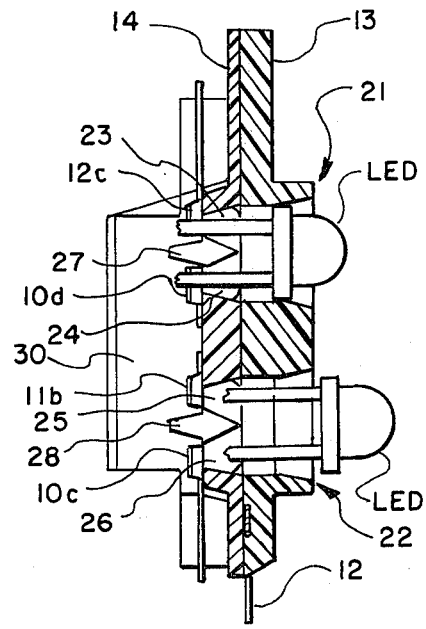
FIG. 7 is a cross sectional view taken along lines 7—7 of FIG. 3 and showing one LED being inserted into the socket and another LED fully received in the socket.

Once folded and latched, the socket is ready for the insertion of the electrical components, such as the LED's shown in FIG. 7. The leads on each LED are cut to a predetermined length prior to insertion, with each LED being inserted into one of the openings formed by the molded collars 21 and 22. Inside each of the openings formed by the molded collars 21 and 22 are two small lead guide openings 23, 24 and 25, 26, respectively. As the leads exit on the opposite side of the first body member, the leads remain separated by dividers 27 and 28, which are located between lead gripping structures 12c, 10d and 11b, 10c, respectively. Lead gripping structures 12c and 10d each receives and grips one lead from an LED, with the leads from the other LED being received and gripped by lead-gripping structures 11b and 10c. Each lead-gripping structure is formed in a portion of a conductor strap by slitting or perforating the metal in the same direction that the lead is intended to be inserted, thereby providing for the easy insertion of the lead with maximum resistance being provided when withdrawal of the lead is attempted. Because these leads on the LED's are cut to a predetermined length, the leads project only slightly on the other side of the lead-gripping structures.

Figure 4:
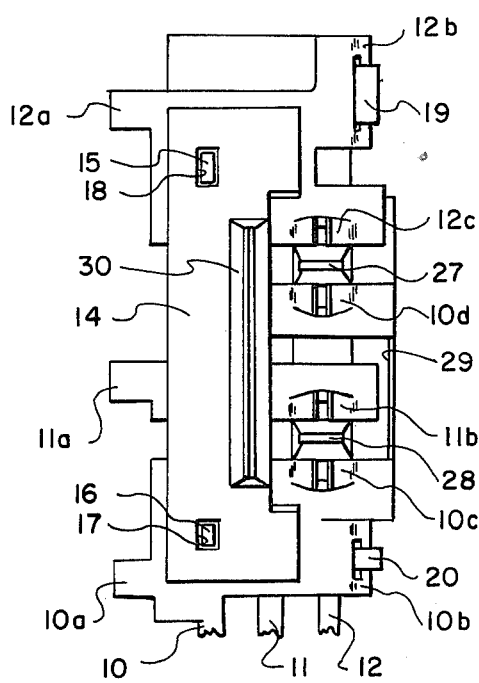
FIG. 4 is a bottom view of the completed socket.
Figure 5:
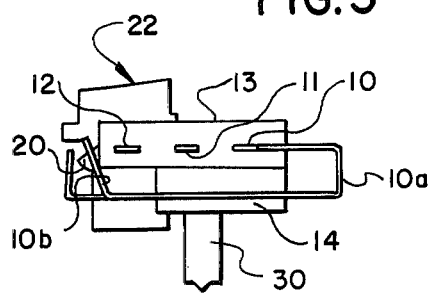
FIG. 5 is an end view of the completed socket.
Figure 6:
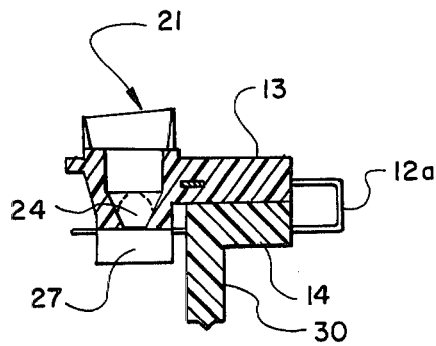
FIG. 6 is a cross sectional view taken along lines 6—6 of FIG. 3.

A support extension 30 (FIGS. 4-5) projects from the exterior surface of the second body member 14, where it is substantially centered longitudinally of that member. It is intended that the support extension be received by a mounting bracket (not shown) when the socket assembly is installed in the apparatus with which it was intended to be used. The support extension shown is by way of illustration only and may take many forms, depending upon the final mounting requirements.

It should be appreciated, that for clarity of illustration, only one specific form of socket structure has been shown. However, the invention clearly lends itself to use with many types of electrical components such as lamps, transistors, etc. In addition, modifications could be made to the conductor straps; for example, the conductive portion 29 which both electrically and mechanically connects the lead-gripping structures 10d and 10c could be removed and a similar type connector could be formed during manufacture to join different ones of the lead-gripping structures. Conductive straps 10, 11, and 12 which have been illustrated generally as extending to other portions of an outsert molded circuit could also be modified by forming those metal conductors into connectors that may be readily attached to a printed circuit board or shaped into other forms of known electrical connector interfaces.

The invention has been described in detail with particular reference to a preferred embodiment thereof, but it will be understood that variations and modifications can be effected within the spirit and scope of the invention.

What is claimed is:

1. A socket for at least one electrical component having conductive leads, said socket comprising:
   (a) a plurality of metal conductor straps, each defining a lead-gripping structure;
   (b) two molded plastic body members outsert molded to said conductor straps while said conductor straps and said body members are substantially coplanar with one another, said body members being spaced apart and joined by portions of said conductor straps that are bendable between said body members to provide a hinge structure that allows mutually facing surfaces of said body members to be positioned in confronting abutment with one another; and
   (c) means defining guide holes in one of said body members for receiving the leads of said electrical component and for aligning said leads for engagement by respective ones of said lead-gripping structures.

2. The socket defined in claim 1 wherein said body members define complementary mating elements engageable with one another to align said body members when said body members are in confronting abutment.

3. The socket defined in claim 1 wherein said socket further comprises:
   at least one clip engagement surface defined by one of said body members along one edge thereof; and
   at least one clip element defined by one of said conductor straps adjacent the other of said body members, said clip element being engageable with said clip engagement surface to maintain said body members in confronting abutment with one another.

4. The socket defined in claim 3 wherein the clip engagement surface defined by one of said body members is along the edge thereof opposite said hinge structure.

5. The socket defined in claim 1 wherein at least four lead-gripping structures are adjacent one edge of said body member, two non-adjacent ones of said lead-gripping structures being common to the same conductor strap.

* * * * *